United States Patent
Grivna

(10) Patent No.: US 10,074,611 B1
(45) Date of Patent: Sep. 11, 2018

(54) SEMICONDUCTOR DEVICE AND METHOD OF FORMING BACKSIDE OPENINGS FOR AN ULTRA-THIN SEMICONDUCTOR DIE

(71) Applicant: SEMICONDUCTOR COMPONENTS INDUSTRIES, LLC, Phoenix, AZ (US)

(72) Inventor: Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/452,888

(22) Filed: Mar. 8, 2017

(51) Int. Cl.
*H01L 23/544* (2006.01)
*H01L 21/78* (2006.01)
*H01L 23/58* (2006.01)

(52) U.S. Cl.
CPC ............ *H01L 23/544* (2013.01); *H01L 21/78* (2013.01); *H01L 23/585* (2013.01); *H01L 2223/5446* (2013.01)

(58) Field of Classification Search
CPC ...... H01L 21/78; H01L 23/544; H01L 23/585
USPC ........................................................ 257/620
See application file for complete search history.

(56) References Cited

U.S. PATENT DOCUMENTS

| 4,191,788 A * | 3/1980 | Harrington ........... H01L 21/302 148/33.2 |
| 6,033,489 A | 3/2000 | Marchant et al. |
| 6,087,199 A * | 7/2000 | Pogge ............... H01L 21/76838 257/E21.582 |
| 2007/0042549 A1 | 2/2007 | Zeng |
| 2007/0202665 A1 | 8/2007 | Collins et al. |
| 2011/0201179 A1 | 8/2011 | Li et al. |
| 2012/0168947 A1 | 7/2012 | Kim et al. |
| 2016/0172464 A1 | 6/2016 | Grivna |

* cited by examiner

*Primary Examiner* — Theresa T Doan
(74) *Attorney, Agent, or Firm* — Robert D. Atkins; Patent Law Group: Atkins and Associates, P.C.

(57) ABSTRACT

A semiconductor substrate contains a plurality of openings extending partially into a surface of the semiconductor substrate. A conductive layer is formed with a first portion of the conductive layer over a remaining portion of the surface of the semiconductor substrate between the openings and a second portion of the conductive layer in the openings. The remaining portion of the surface of the semiconductor substrate is removed to lift-off the first portion of the conductive layer while leaving the second portion of the conductive layer in the openings. The semiconductor substrate is singulated to separate the semiconductor die leaving the second portion of the conductive layer over a surface of the semiconductor die. Alternatively, a plurality of openings is formed over each semiconductor die. A conductive layer is formed over a remaining portion of the surface of the semiconductor substrate between the openings and into the openings.

20 Claims, 10 Drawing Sheets

US 10,074,611 B1

SEMICONDUCTOR DEVICE AND METHOD OF FORMING BACKSIDE OPENINGS FOR AN ULTRA-THIN SEMICONDUCTOR DIE

FIELD OF THE INVENTION

The present invention relates in general to semiconductor devices and, more particularly, to a semiconductor device and method of forming backside openings for an ultra-thin semiconductor die.

BACKGROUND

A semiconductor wafer or substrate can be made with a variety of base substrate materials, such as silicon (Si), germanium, aluminum phosphide, aluminum arsenide, gallium arsenide (GaAs), gallium nitride (GaN), aluminum gallium nitride over gallium nitride (AlGaN/GaN), indium phosphide, silicon carbide (SiC), or other bulk material for structural support. A plurality of semiconductor die is formed on the wafer separated by a non-active, inter-die substrate area or saw street. The saw street provides cutting areas to singulate the semiconductor wafer into individual semiconductor die.

In a vertical semiconductor device, the primary current path is vertical from the top surface of the die to a back surface of the die. The vertical resistance, e.g., drain-source resistance (RDSON) of a vertical transistor, decreases with the thickness of the semiconductor die. To minimize vertical resistance, the semiconductor die should be as thin as possible while still maintaining structural integrity. An opening can be formed in the back surface to reduce thickness of the semiconductor die and vertical resistance. A thick metal layer, such as 25 micrometers (μm) copper, is formed across the back surface and into the opening for structural support and electrical interconnect. Unfortunately, cutting through the thick metal layer within the saw street to separate the semiconductor die can be difficult and impose premature wear and excessive cutting debris on the saw blade.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Figure 1A:
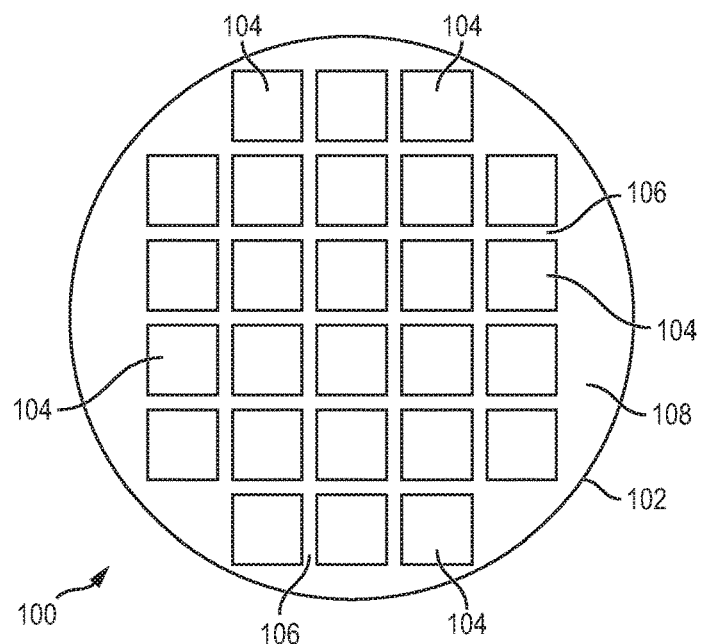
FIGS. 1a-1b illustrate a semiconductor substrate with a plurality of semiconductor die separated by a saw street.

FIG. 1a shows a semiconductor wafer or substrate 100 with a base substrate material 102, such as Si, germanium, aluminum phosphide, aluminum arsenide, GaAs, GaN, AlGaN/GaN, indium phosphide, SiC, or other bulk material for structural support. Semiconductor substrate 100 has a width or diameter of 100-450 millimeters (mm) and thickness of about 700-800 micrometers (μm). A plurality of semiconductor die 104 is formed on substrate 100 separated by a non-active, inter-die substrate area or saw street 106. Saw street 106 provides cutting areas to singulate semiconductor substrate 100 into individual semiconductor die 104.

Figure 1B:
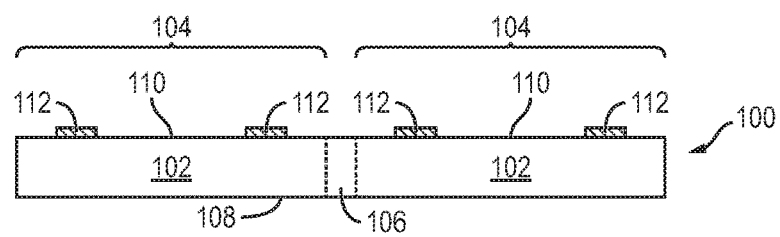

FIG. 1b shows a cross-sectional view of a portion of semiconductor substrate 100. Each semiconductor die 104 includes a back surface 108 and active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits. In one embodiment, semiconductor die 104 implements a diode, transistor, or other discrete semiconductor device. In a vertical transistor, the gate region and source region are typically accessible on active surface 110, and the drain region of the vertical transistor is back surface 108. Semiconductor die 104 may also contain a digital signal processor (DSP), microcontroller, ASIC, standard logic, amplifiers, clock management, memory, interface circuit, optoelectronics, and other signal processing circuits. Semiconductor die 104 may also contain integrated passive devices (IPDs), such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), titanium (Ti), titanium tungsten (TiW), TiNiCu, TiNiAg, or other suitable electrically conductive material. Conductive layer 112 operates as contact pads electrically connected to the circuits, e.g., gate region and source region of the vertical transistor, on active surface 110.

Figure 2A:
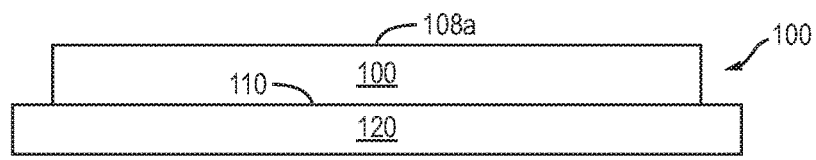
FIGS. 2a-2l illustrate a process of forming a backside opening to enable lift-off of a backside metal.
Figure 2B:
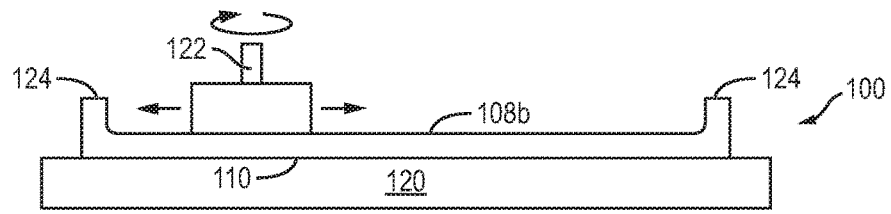
Figure 2C:
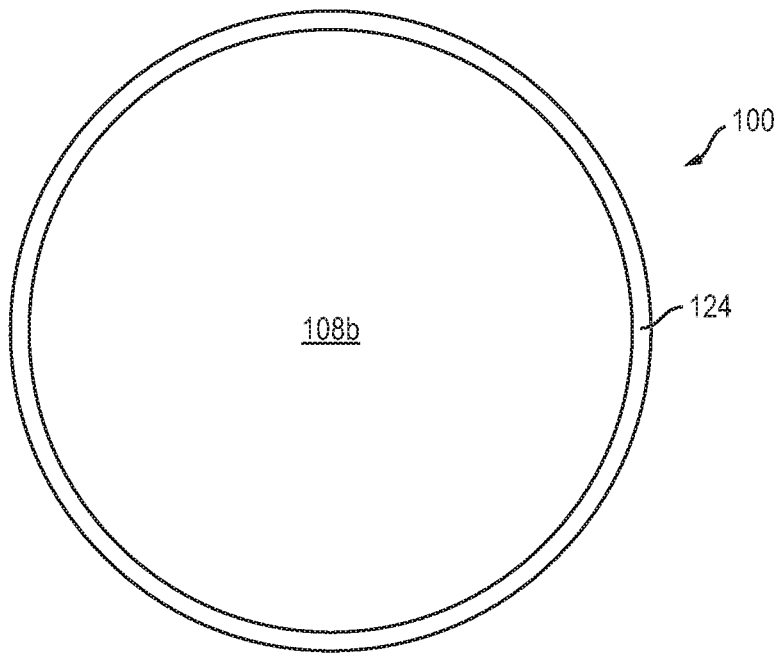

FIGS. 2a-2l show a process of forming a backside opening to achieve an ultra-thin semiconductor die and enable lift-off of a backside metal without singulation through the backside metal. In FIG. 2a, semiconductor substrate 100 is positioned with active surface 110 oriented toward carrier or backgrinding tape 120. In FIG. 2b, an interior region of back surface 108a of semiconductor substrate 100 is thinned with grinding wheel 122, leaving a thick support ring 124 around a perimeter of the semiconductor substrate. FIG. 2c illustrates back surface 108b, after thinning, of semiconductor substrate 100 with optional support ring 124 for structural support. In one embodiment, semiconductor wafer 100 has a thickness of 90-150 μm between active surface 110 and back surface 108b.

Figure 2D:
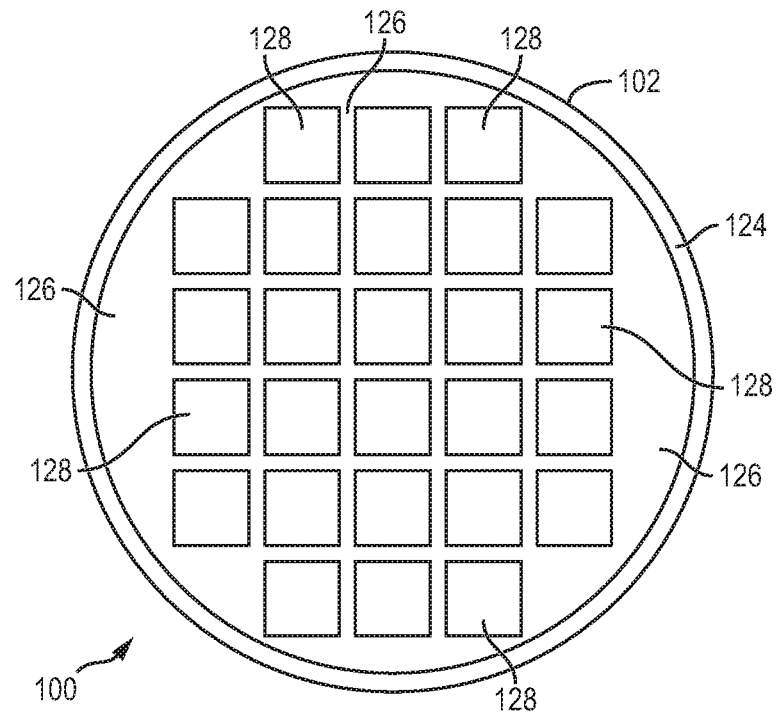

In FIG. 2d, photoresist layer 126 is formed over back surface 108b of semiconductor substrate 100. Photoresist layer 126 is patterned with openings 128 over back surface 108b. There is one opening 128 aligned with each semiconductor die 104.

Figure 2E:
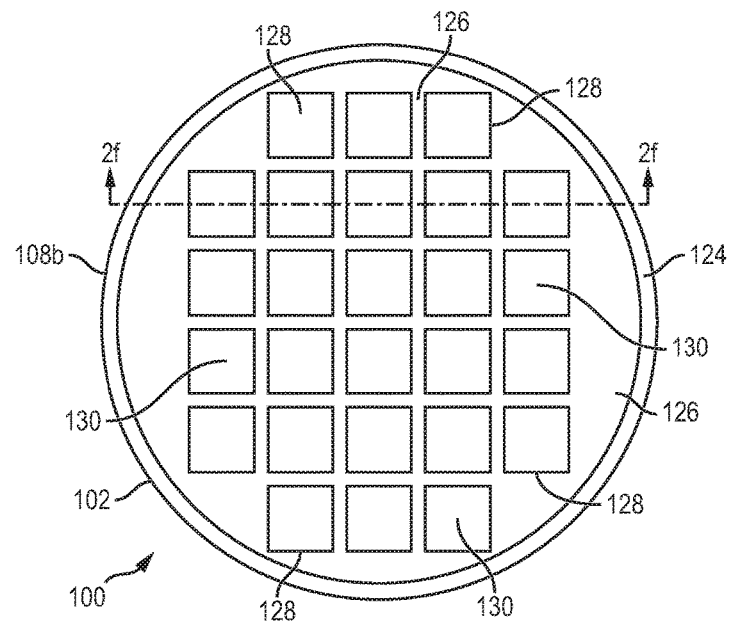

In FIG. 2e, a plurality of openings 130 is formed partially into back surface 108b but not completely through base substrate material 102 through openings 128 by isotropic etching, non-isotropic etching, or laser direct ablation (LDA). Photoresist layer 126 covers any laser mark area of semiconductor substrate 100 to avoid forming opening 130 within the laser mark area.

Figure 2F:
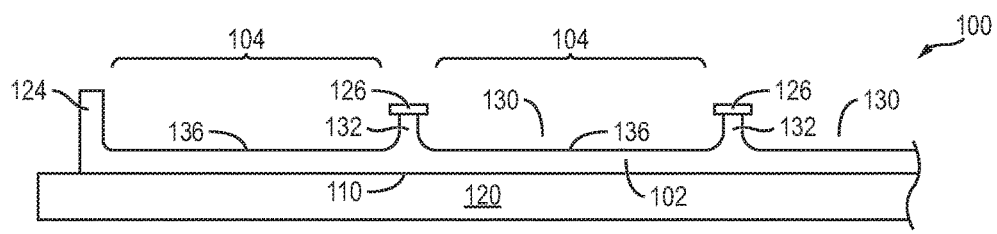

FIG. 2f shows a cross-sectional view, taken along line 2f-2f of FIG. 2e, of a portion of semiconductor substrate 100 with support ring 124 and openings 130 partially through base substrate material 102. In particular, each opening 130 is formed over one semiconductor die 104, i.e., the boundaries of the opening align with the boundaries of the semiconductor die. In one embodiment, openings 130 have a width of 2000 μm and depth of 65-75 μm. The isotropic etch leaves pillars 132 of base substrate material 102 between openings 130 in an area defining saw streets 106. In one embodiment, pillars 132 have a width of 20 μm. A portion of photoresist layer 126 remains over pillars 132. Surface 136 defines the bottom of opening 130 and the new back surface of semiconductor die 104.

Figure 2G:
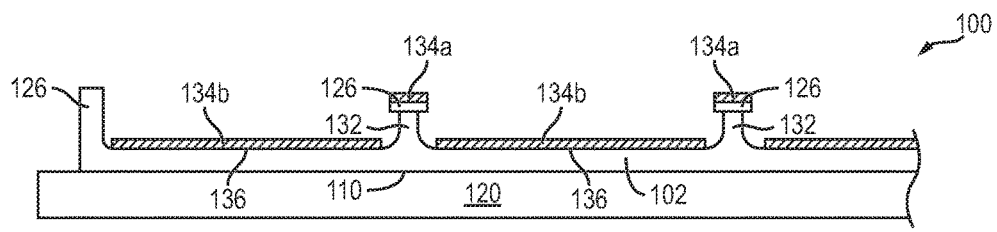

In FIG. 2g, an electrically conductive layer 134 is formed over the pedestal defined by photoresist layer 126 on pillars 132 and into openings 130 over surface 136 using evaporation, sputtering, PVD, CVD, or other suitable metal deposition process. Conductive layer 134 includes one or more layers of Al, Cu, Sn, Ni, Au, Ag, Ti, TiW, TiNiCu, or other suitable electrically conductive material. In one embodiment, conductive layer 134 has a thickness of 20-50 μm or more to provide support for the ultra-thin semiconductor die 104. In particular, conductive layer portion 134a is formed over the pedestal defined by photoresist layer 126 on pillars 132, and conductive layer portion 134b is formed into openings 130 over surface 136. Photoresist layer 126 on pillars 132 of base substrate material 102 elevates and separates conductive layer portion 134a with respect to conductive layer portion 134b in openings 130.

Figure 2H:
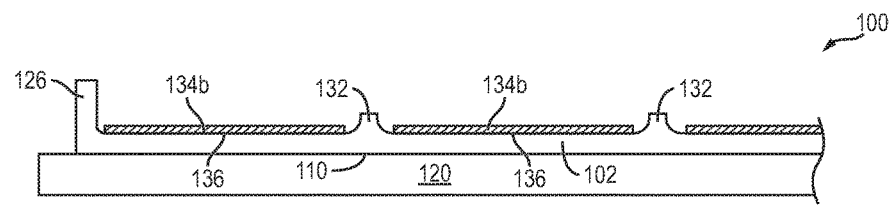

In FIG. 2h, conductive layer portion 134a is removed or lifted-off by dissolving photoresist layer 126 using a solvent spray or bath with ultrasonic action. The solvent does not remove conductive layer portion 134b, which remains over surface 136 of semiconductor die 104. Alternatively, the lift-off of conductive layer portion 134a can be done with a hard-mask for wet etched openings 130. A portion of pillars 132 of base substrate material 102 may remain between semiconductor die 104 after lift-off of conductive layer portion 134a. The surface level of conductive layer 134a may be less than or greater than the surface level of pillars 132. The lift-off of conductive layer portion 134a eliminates the singulation issues of the saw blade cutting through thick metal, as described in the background.

Figure 2I:
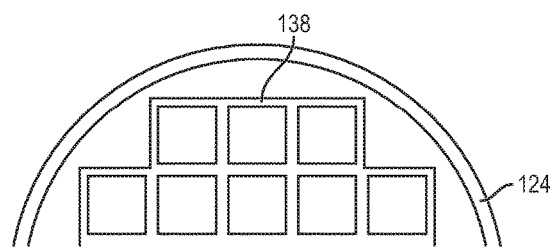

In FIG. 2i, an edge pattern 138 is an opening formed in photoresist layer 126 around a perimeter of semiconductor substrate 100. A thicker metal is more difficult to lift-off. Edge pattern opening 138 provides a break to assist with lift-off of thicker conductive layer 134a for semiconductor die 104 having side surfaces proximate to the perimeter of semiconductor substrate 100. The continuous break of conductive layer 134a extends around the perimeter of semiconductor substrate 100 by nature of edge pattern opening 138.

Figure 2J:
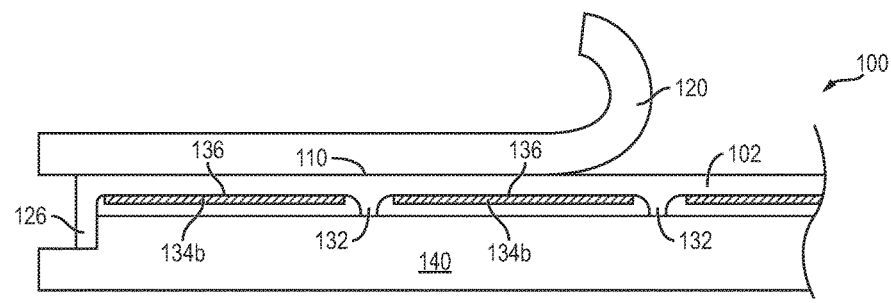

In FIG. 2j, semiconductor substrate 100 with backgrinding tape 120 is inverted with back surface 136 and conductive layer portion 134b oriented toward carrier 140. Semiconductor substrate 100 is mounted to carrier 140 and backgrinding tape 120 is removed. Optional support ring 124 can provide additional support of the thinned semiconductor substrate 100 during wafer handling.

Figure 2K:
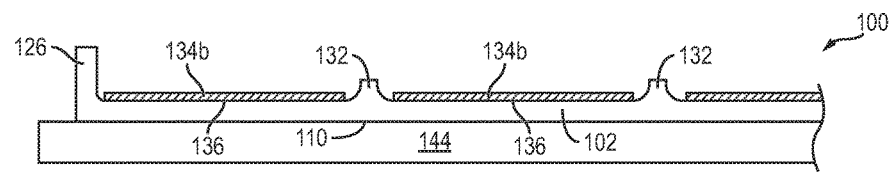

In FIG. 2k, semiconductor substrate 100 is again inverted with active surface 110 and conductive layer 112 oriented toward dicing tape 144. Semiconductor substrate 100 is mounted to dicing tape 144.

Figure 2L:
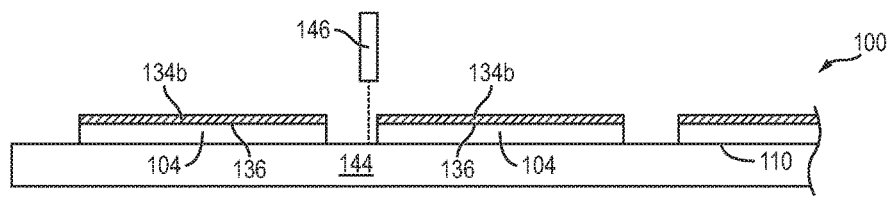

In FIG. 2l, semiconductor substrate 100 is singulated through saw street 106 and pillars 132 by plasma etching. Plasma etching has advantages of forming precision side surfaces along saw streets 106, while retaining the structure and integrity of the base substrate material. Alternatively, semiconductor substrate 100 is singulated through saw street 106 and pillars 132 using a saw blade or laser cutting tool 146 into individual semiconductor die 104. The singulation occurs without cutting through a thick conductive layer. Support ring 124 is also removed during singulation. Support ring 124 could have been removed in FIG. 2h.

Figure 3:
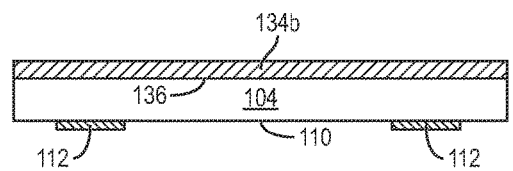
FIG. 3 illustrates the semiconductor die of FIGS. 2a-2l post singulation.

FIG. 3 shows ultra-thin semiconductor die 104 post singulation. In one embodiment, semiconductor die 104 has a thickness of 50 μm, i.e., 25 μm for base substrate material 102 and conductive layer 112, and 25 μm for conductive layer 134b. In some embodiments toward the edge of the die 104, conductive layer 134 may decrease in thickness and substrate 110 may increase in thickness. Conductive layer 112 provides electrical connection for the source region and gate region of the vertical transistor. Conductive layer 134b is formed within openings 130, while conductive layer 134a is formed over photoresist layer 126 on pillars 132. Photoresist layer 126 is removed to lift-off conductive layer portion 134a. Conductive layer 134b remains on back surface 136 of semiconductor die 104 after the lift-off to provide electrical connection for the drain region of the vertical transistor. The lift-off of conductive layer 134a allows semiconductor substrate 100 to be singulated through saw street 106 and pillars 132, without the need to cut through a thick metal layer.

Figure 4A:
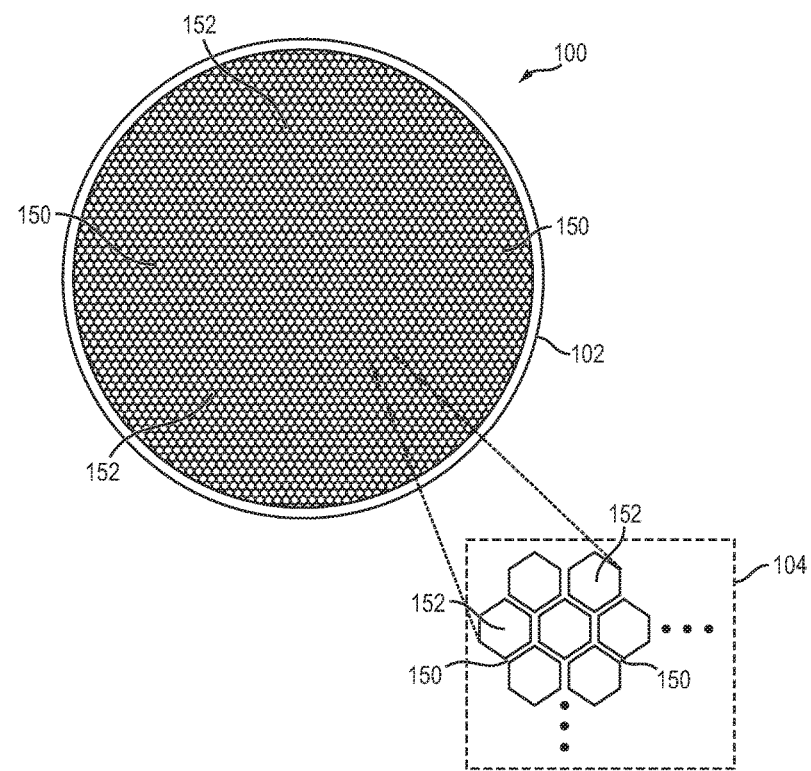
FIGS. 4a-4n illustrate a process of forming honeycomb pattern of base substrate material for support of ultra-thin semiconductor die.
Figure 4B:
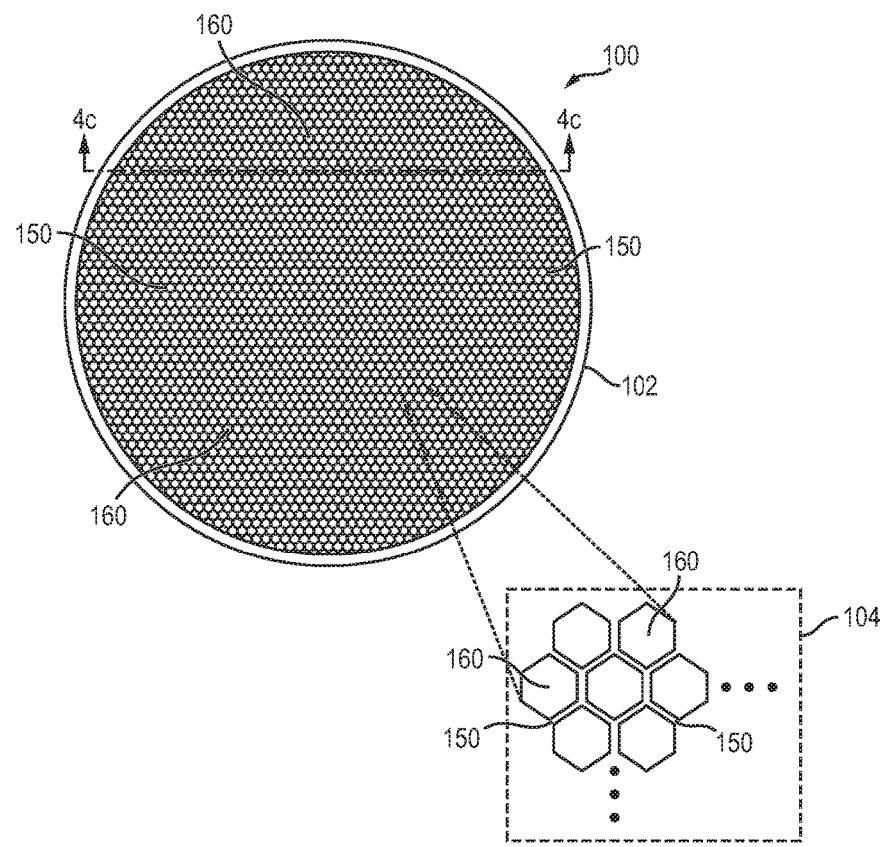
Figure 4C:
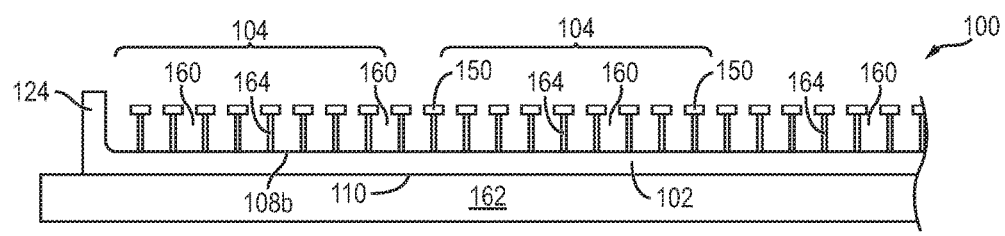
Figure 4D:
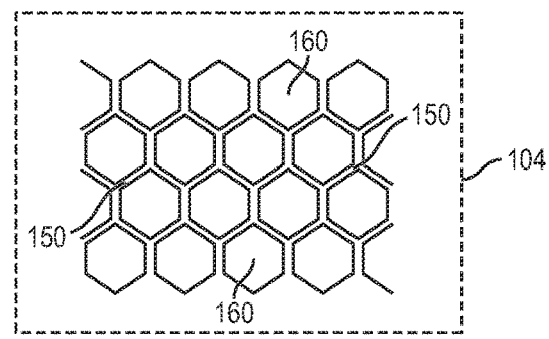
Figure 4E:
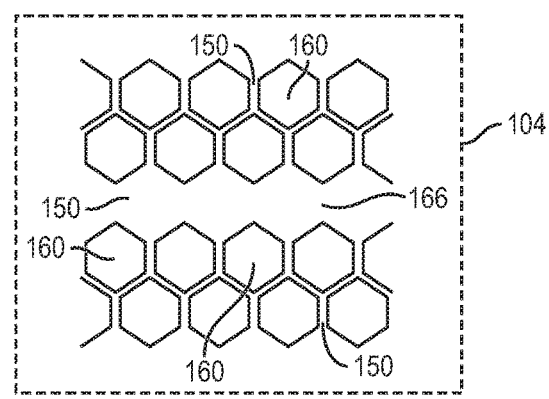
Figure 4F:
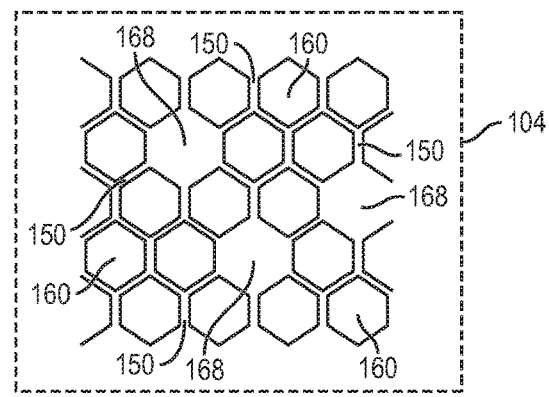
Figure 4G:
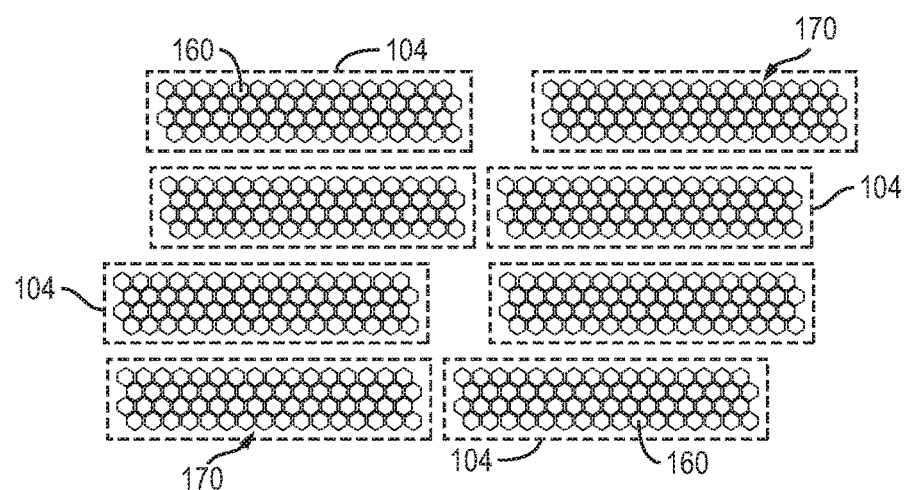
Figure 4H:
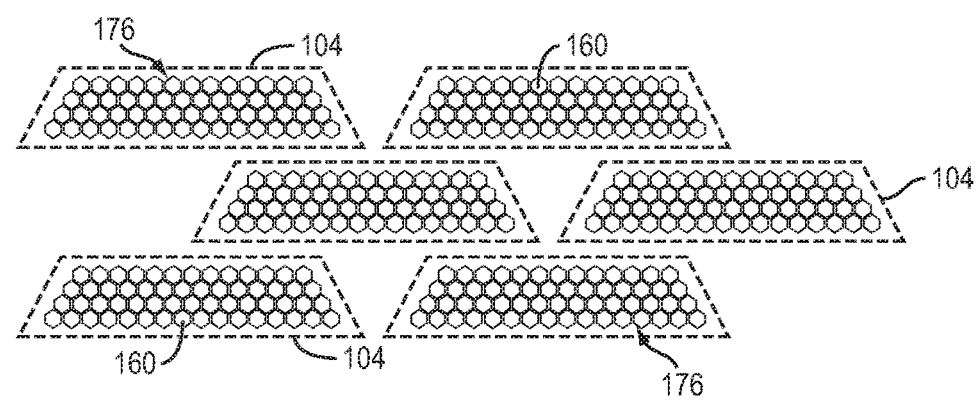
Figure 4I:
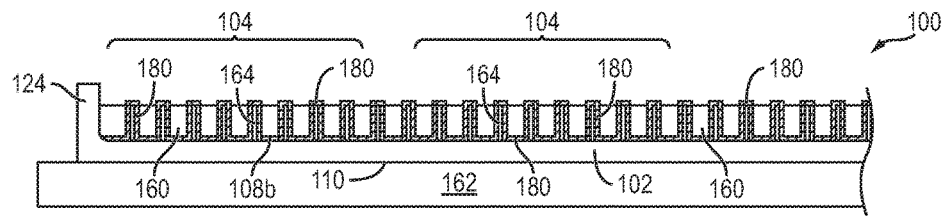
Figure 4J:
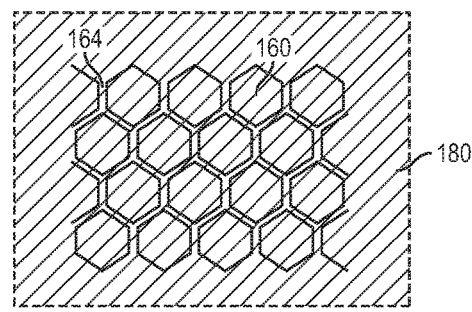
Figure 4K:
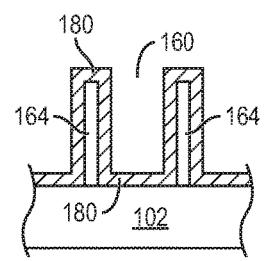
Figure 4L:
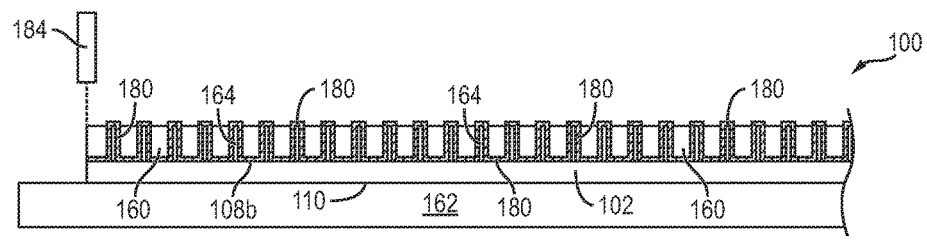
Figure 4M:
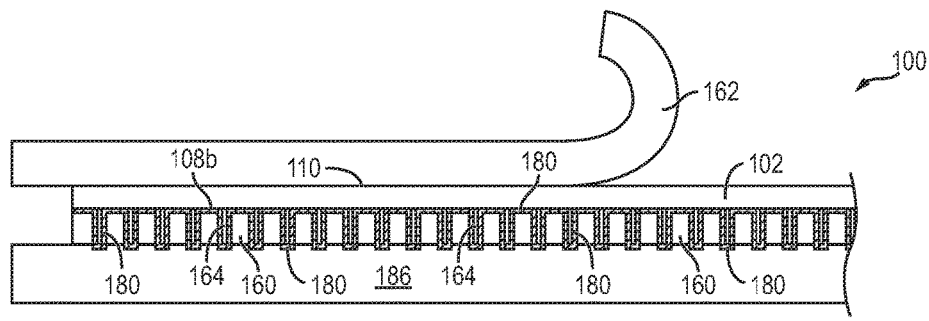
Figure 4N:
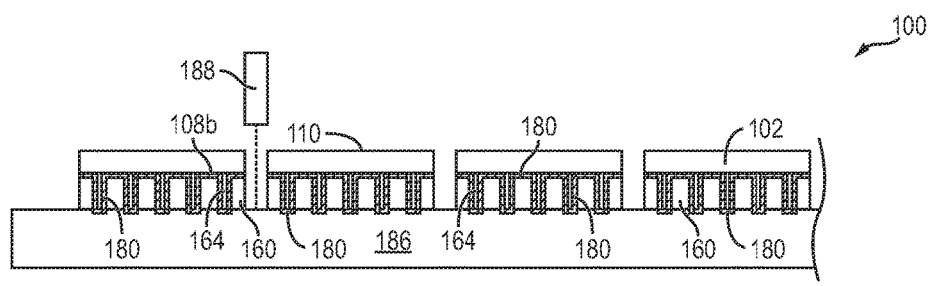

FIGS. 4a-4n show a process of forming a plurality of backside openings for an ultra-thin semiconductor die. Continuing from FIG. 2c, a photoresist layer 150 is formed over back surface 108b of semiconductor substrate 100, as shown in FIG. 4a. Photoresist layer 150 is patterned with offset hexagon-shaped openings 152 over back surface 108b, or alternate opening shapes such as circles, rectangles, lines, or combinations of each. There are many openings 152 for each semiconductor die.

In FIG. 4b, a plurality of hexagon-shaped openings 160 is formed partially into back surface 108b but not completely through base substrate material 102 through openings 152 by isotropic etching or non-isotropic etching that is independent of substrate 100 crystal orientation. The hexagon-shaped openings 160 are arranged in an offset pattern of multiple rows formed partially into base substrate material 102 within the boundaries of one semiconductor die 104. In one embodiment, openings 160 each have a width of 200 μm or less and depth of 65-75 μm for a 2 mm by 2 mm semiconductor die 104. Photoresist layer 150 covers any laser mark area of semiconductor substrate 100 to avoid forming opening 160 within the laser mark area.

FIG. 4c shows a cross-sectional view, taken along line 4c-4c of FIG. 4b, of a portion of semiconductor substrate 100 with support ring 124 and openings 160 disposed on carrier or backgrinding tape 162. Support ring 124 can be formed separately or simultaneously as pillars 164 by using photoresist layer 150. A portion of photoresist layer 150 remains over base substrate material 102 between openings 152 to form openings 160. Photoresist layer 150 between openings 152 leaves base substrate material 102 between each opening 160, i.e., under photoresist layer 150 between adjacent openings 152. Base substrate material 102 has a honeycomb pattern 164 around the offset pattern of openings 160 over back surface 108b of semiconductor die 104, see FIG. 4d. The thickness of honeycomb pattern 164 of base substrate material 102 over back surface 108b of semiconductor die 104 is the thickness of semiconductor substrate 100, i.e., 90-150 µm, for structural support of semiconductor die 104. Openings 160 make up the vast majority of the area of semiconductor die 104 ultra-thin for low on-resistance. In other words, the thickness of semiconductor die 104 between active surface 110 and the bottom of each opening 160 is about 20-50 µm. The large number of openings 160 across a surface area of semiconductor die 104 allows the majority of drain current to flow through the ultra-thin base substrate material 102 to achieve the low on-resistance. The honeycomb pattern 164 of base substrate material 102 over back surface 108b of semiconductor die 104 take little area but provides support for the remaining ultra-thin regions of semiconductor die 104.

FIG. 4e shows another embodiment with region 166 of photoresist layer 150 between rows of honeycomb pattern 164. Region 166 of photoresist layer 150 leaves base substrate material 102 between the rows of honeycomb pattern 164 for additional support. Other patterns of openings 160 can be formed in base substrate material 102. For example, there can be base substrate material 102 between columns of honeycomb pattern 164 for additional support. FIG. 4f shows regions 168 of photoresist layer 150 disposed interstitially within honeycomb pattern 164. Regions 168 of photoresist layer 150 leave larger regions of base substrate material 102 disposed interstitially within honeycomb pattern 164 for additional support. Openings 160 in honeycomb pattern 164 still occupy the majority of the area of semiconductor die 104 ultra-thin for low on-resistance. The large number of openings 160 across a surface area of semiconductor die 104 allows the majority of drain current to flow through the ultra-thin base substrate material 102 to achieve the low on-resistance. The honeycomb pattern 164 of base substrate material 102 over back surface 108b of semiconductor die 104 take a small portion of the area but provides support for the remaining ultra-thin regions of semiconductor die 104.

FIG. 4g shows another embodiment with a high aspect ratio semiconductor die 104 offset on semiconductor substrate 100. In this case, the length of semiconductor die 104 is greater than its width. The boundaries of the offset pattern of hexagon-shaped openings 160 align with the boundaries of semiconductor die 104. The offset pattern of openings 160 leaves base substrate material 102 between each opening 160, i.e., under photoresist layer 150 between adjacent openings 152. Base substrate material 102 has a honeycomb pattern 170 around the offset pattern of openings 160 over back surface 108b of semiconductor die 104. Openings 160 make the vast majority of the area of semiconductor die 104 ultra-thin for low on-resistance. Honeycomb pattern 170 of base substrate material 102 over back surface 108b of semiconductor die 104 take little area but provides support for remaining ultra-thin regions of semiconductor die 104. The remaining photoresist layer 150 between semiconductor die 104 leaves additional base substrate material 102 to provide additional support.

FIG. 4h shows yet another embodiment with a high aspect ratio semiconductor die 104 offset on semiconductor substrate 100. The boundaries of the offset pattern of hexagon-shaped openings 160 align with the boundaries of semiconductor die 104. The offset pattern of openings 160 leaves base substrate material 102 between each opening 160, i.e., under photoresist layer 150 between adjacent openings 152. Base substrate material 102 has a honeycomb pattern 176 around the offset pattern of openings 160 over back surface 108b of semiconductor die 104. Openings 160 make the vast majority of the area of semiconductor die 104 ultra-thin for low on-resistance. Honeycomb pattern 176 of base substrate material 102 over back surface 108b of semiconductor die 104 take little area but provides support for remaining ultra-thin regions of semiconductor die 104. The remaining photoresist layer 150 between semiconductor die 104 leaves additional base substrate material 102 to provide additional support and can act as a solder dam to control solder movement. Additional base substrate material separate from the honeycomb structures, can be retained interior to the die for additional structural support.

Returning to FIG. 4d, photoresist layer 150 is removed and an electrically conductive layer 180 is formed over honeycomb pattern 164 of base substrate material 102 and into openings 160 using evaporation, sputtering, PVD, CVD, or other suitable metal deposition process, as shown in FIG. 4i. FIG. 4j shows a plan view of conductive layer 180 formed over honeycomb pattern 164 of base substrate material 102 and into openings 160. FIG. 4k shows adjacent openings 160 in honeycomb pattern 164 of base substrate material 102 covered by conductive layer 180, including the top surface, side surfaces, and bottom surface of the structure. Conductive layer 180 includes one or more layers of Al, Cu, Sn, Ni, Au, Ag, Ti, TiW, TiNiCu, TiNiAg, or other suitable electrically conductive material. Conductive layer 180 provides electrical connection for the drain region of the vertical transistor. Conductive layer 180 is made relatively thin, e.g., 0.5-1.5 µm or less, because the primary support for the ultra-thin semiconductor die 104 is realized with honeycomb pattern 164 of base substrate material 102.

In FIG. 4l, support ring 124 may be removed by a saw blade or laser cutting tool 184.

In FIG. 4m, semiconductor substrate 100 with backgrinding tape 120 is inverted with back surface 108b and conductive layer 180 oriented toward dicing tape 186. Semiconductor substrate 100 is mounted to dicing tape 186. Backgrinding tape 162 is removed.

In FIG. 4n, semiconductor substrate 100 is singulated through saw street 106 by plasma etching. Plasma etching has advantages of forming precision side surfaces along saw streets 106, while retaining the structure and integrity of the base substrate material. Alternatively, semiconductor substrate 100 is singulated through saw street 106 using a saw blade or laser cutting tool 188 into individual semiconductor die 104. Plasma etch or saw blade 188 easily cuts or breaks through the relatively thin conductive layer 180. Honeycomb patterns 170 and 176 of base substrate material 102 for offset semiconductor die 104 in FIGS. 4g-4h would follow the same process of FIGS. 4i-4n.

Figure 5:
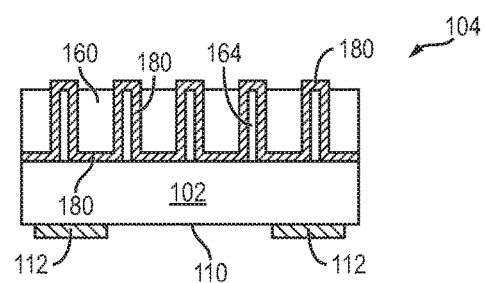
FIG. 5 illustrates the semiconductor die of FIGS. 4a-4n post singulation.

FIG. 5 shows semiconductor die 104 post singulation. Conductive layer 112 provides electrical connection for the source region and gate region of the vertical transistor. Honeycomb pattern 164 of base substrate material 102 provides structural support for semiconductor die 104. Conductive layer 180 provides electrical connection for the drain region of the vertical transistor. Semiconductor die 104 with honeycomb pattern 164 is robust during die handling, while retaining a low on-resistance through the ultra-thin portions of the die. The relatively thin conductive layer 180 can be easily cut or broken by plasma etch or saw blade without the singulation issues encountered by the thick metal layer.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
   providing a semiconductor substrate;
   forming a plurality of openings extending partially into a surface of the semiconductor substrate to form a flat bottom surface in the openings;
   forming a conductive layer including a first portion of the conductive layer over a remaining portion of the semiconductor substrate between the openings and a second portion of the conductive layer over the flat bottom surface in the openings; and
   removing the first portion of the conductive layer and at least a portion of the remaining portion of semiconductor substrate while leaving the second portion of the conductive layer over the flat bottom surface in the openings.

2. The method of claim 1, further including singulating the semiconductor substrate to separate a plurality of semiconductor die formed on the semiconductor substrate leaving the second portion of the conductive layer over a surface of the semiconductor die.

3. The method of claim 2, wherein a first opening of the plurality of openings is aligned with a first semiconductor die of the plurality of second semiconductor die.

4. The method of claim 2, wherein forming the plurality of openings reduces a thickness of the plurality of semiconductor die.

5. The method of claim 1, wherein a thickness of the conductive layer is about 20-50 micrometers.

6. The method of claim 1, further including forming a support ring around the semiconductor substrate.

7. A method of making a semiconductor device, comprising:
   providing a semiconductor substrate including a plurality of semiconductor die;
   forming a plurality of openings over each semiconductor die and extending partially into a surface of the semiconductor substrate to form a flat bottom surface in the openings; and
   forming a conductive layer over a remaining portion of the surface of the semiconductor substrate between the openings and over the flat bottom surface in the openings.

8. The method of claim 7, further including singulating the semiconductor substrate to separate the semiconductor die.

9. The method of claim 7, wherein the remaining portion of the surface of the semiconductor substrate between the openings includes a honeycomb pattern.

10. The method of claim 7, wherein the remaining portion of the surface of the semiconductor substrate between the openings includes a pattern or shape.

11. The method of claim 7, wherein forming the plurality of openings reduces a thickness of the plurality of semiconductor die.

12. The method of claim 7, wherein a thickness of the conductive layer is less than 1.5 micrometers.

13. The method of claim 7, further including forming a support ring around the semiconductor substrate.

14. A method of making a semiconductor device, comprising:
   providing a semiconductor substrate including a plurality of semiconductor die;
   forming a plurality of openings over each semiconductor die and extending partially into a surface of the semiconductor substrate to form a flat bottom surface in the openings; and
   forming a conductive layer over a remaining portion of the semiconductor substrate between the openings and over the flat bottom surface in the openings; and
   removing the first portion of the conductive layer and at least a portion of the remaining portion of semiconductor substrate while leaving the conductive layer over the flat bottom surface in the openings.

15. The method of claim 14, further including disposing the plurality of openings formed over each semiconductor die in multiple offset rows.

16. The method of claim 14, wherein the remaining portion of the surface of the semiconductor substrate between the openings includes a honeycomb pattern.

17. The method of claim 14, wherein the remaining portion of the surface of the semiconductor substrate between the openings includes a pattern or shape.

18. The method of claim 14, wherein the plurality of openings reduces a thickness of the plurality of semiconductor die.

19. The method of claim 14, wherein a thickness of the conductive layer is less than 1.5 micrometers.

20. The method of claim 14, wherein the plurality of semiconductor die is offset on the semiconductor substrate.

* * * * *